United States Patent
Jourdan et al.

(10) Patent No.: US 8,072,075 B2
(45) Date of Patent: Dec. 6, 2011

(54) CUSIN/SIN DIFFUSION BARRIER FOR COPPER IN INTEGRATED-CIRCUIT DEVICES

(76) Inventors: Nicolas Jourdan, Grenoble (FR); Laurant Georges Gosset, Grenoble (FR); Joaquin Torres, Saint Martin le Vinoux (FR)

(*) Notice: Subject to any disclaimer, the term of this patent is extended or adjusted under 35 U.S.C. 154(b) by 373 days.

(21) Appl. No.: 12/439,910

(22) PCT Filed: Aug. 29, 2007

(86) PCT No.: PCT/EP2007/058998
§ 371 (c)(1),
(2), (4) Date: Mar. 4, 2009

(87) PCT Pub. No.: WO2008/028850
PCT Pub. Date: Mar. 13, 2008

(65) Prior Publication Data
US 2009/0273085 A1    Nov. 5, 2009

(30) Foreign Application Priority Data
Sep. 4, 2006 (EP) .................................. 06300920

(51) Int. Cl.
*H01L 23/48* (2006.01)
*H01L 21/4763* (2006.01)
(52) U.S. Cl. ........ 257/767; 257/762; 257/758; 257/760; 257/E23.145; 257/E21.268; 438/118; 438/622; 438/624; 438/687
(58) Field of Classification Search .................. 257/758, 257/762, 760, 767, E23.145, E21.268, E21.584; 438/118, 687, 622, 624
See application file for complete search history.

(56) References Cited

U.S. PATENT DOCUMENTS
5,447,887 A * 9/1995 Filipiak et al. ................ 438/644
5,821,168 A 10/1998 Jain
(Continued)

FOREIGN PATENT DOCUMENTS
EP        1351291 A2    8/2003

OTHER PUBLICATIONS

S. Chhun, L.G. Gosset, N. Casanova, D. Ney, D. Delille, C. Trouiller, M. Hopstaken, P. Chausse, M. Gregoire, B. Gautier, J.-C. Dupuy, J. Torres; Impact of introducing CuSiN self-aligned barriers in advanced copper interconnects; Elsevier B.V.; 2005; p. 587-593; Microelectronic Engineering.

*Primary Examiner* — Nitin Parekh

(57) ABSTRACT

The present invention relates to an integrated-circuit device that has at least one Copper-containing feature in a dielectric layer, and a diffusion-barrier layer stack arranged between the feature and the dielectric layer. The integrated-circuit device of the invention has a diffusion-barrier layer stack, which comprises, in a direction from the Copper-containing feature to the dielectric layer, a CuSiN layer and a SiN layer. This layer combination provides an efficient barrier for suppressing Copper diffusion from the feature into the dielectric layer. Furthermore, a CuSiN/SiN layer sequence provides an improved adhesion between the layers of the diffusion-barrier layer stack and the dielectric layer, and thus improves the electromigration performance of the integrated-circuit device during operation. Therefore, the reliability of device operation and the lifetime of the integrate-circuit device are improved in comparison with prior-art devices. The invention further relates to a method for fabricating such an integrated-circuit device.

15 Claims, 8 Drawing Sheets

U.S. PATENT DOCUMENTS

| | | | |
|---|---|---|---|
| 6,181,013 B1 * | 1/2001 | Liu et al. | 257/762 |
| 6,211,084 B1 | 4/2001 | Ngo et al. | |
| 6,660,634 B1 * | 12/2003 | Ngo et al. | 438/687 |
| 6,875,692 B1 | 4/2005 | Chang et al. | |
| 6,919,636 B1 | 7/2005 | Ryan | |
| 6,939,793 B1 | 9/2005 | You et al. | |
| 7,524,755 B2 * | 4/2009 | Widodo et al. | 438/627 |
| 7,816,789 B2 * | 10/2010 | Liu et al. | 257/753 |
| 7,867,889 B2 * | 1/2011 | Besling | 438/622 |
| 2002/0063336 A1 | 5/2002 | Matsubara | |
| 2004/0097075 A1 | 5/2004 | Bradshaw et al. | |
| 2005/0266698 A1 | 12/2005 | Cooney et al. | |
| 2006/0003577 A1 | 1/2006 | Sone | |
| 2006/0186549 A1 * | 8/2006 | Usami et al. | 257/762 |
| 2007/0197023 A1 | 8/2007 | Widodo et al. | |
| 2007/0249156 A1 * | 10/2007 | Bonilla et al. | 438/622 |
| 2008/0132064 A1 * | 6/2008 | Streck et al. | 438/658 |
| 2008/0184543 A1 * | 8/2008 | Sako et al. | 29/25.02 |
| 2008/0299766 A1 * | 12/2008 | Omoto et al. | 438/653 |

* cited by examiner

CUSIN/SIN DIFFUSION BARRIER FOR COPPER IN INTEGRATED-CIRCUIT DEVICES

FIELD OF THE INVENTION

The present invention relates to an integrated-circuit device that has at least one Copper-containing feature in a dielectric layer, and a diffusion-barrier layer stack arranged between the feature and the dielectric layer.

BACKGROUND OF THE INVENTION

In the design of integrated-circuit devices, decreasing the resistance-capacitance (RC) delay time in interconnect elements between the circuit elements, such as transistors, is an important goal for increasing the speed of signal transmission between circuit elements. In order to reduce the RC delay time, a known strategy is to use a porous ultra-low-k (P-ULk) insulator material to decrease the capacitance, and to use Copper-containing material for the interconnect elements for providing a low resistance.

The use of Copper in interconnect elements, however, requires the provision of a diffusion barrier between an interconnect element and the neighboring dielectric layer. For keeping the resistance value of the interconnect element low even in the presence of the diffusion barrier, a thin conformal metallic diffusion-barrier layer stack, for instance containing a layer of TaN and a layer of Ta is used. This allows the low-resistive Copper occupying a large volume in an opening of the dielectric layer provided for the interconnect element or a via vertically connecting interconnect elements on different metal levels of an interconnect stack.

However, this strategy has several disadvantages. The precursor used for the metallic diffusion-barrier deposition may deeply penetrate into the dielectric material, causing device performance issues and a decrease of reliability. Furthermore, the adhesion between the known P-ULk/metal barrier/Copper-containing material layer sequences is poor. Among other problem, this leads to a poor electromigration performance. Electromigration causes premature device failure.

The use of TaN/Ta barrier-layer stack between a Copper-containing feature and the dielectric layer has the further disadvantage that a Ta oxidation or Copper corrosion at the Cu/Ta interface occurs in the context of the deposition of a CoWP layer on top of the feature, which damages the diffusion-barrier layer stack and leads to out-diffusion of Copper into the dielectric layer.

SUMMARY OF THE INVENTION

According to a first aspect of the invention, an integrated circuit device is provided that has at least one Copper-containing feature in a dielectric layer, and a diffusion-barrier layer stack arranged between the feature and the dielectric layer, which diffusion-barrier layer stack comprises, in a direction from the feature to the dielectric layer, a layer sequence of a CuSiN layer and a SiN layer.

The Copper-containing feature is to be understood as any geometrical structure that is provided in the dielectric layer and contains Copper or consists of Copper. Examples are, without limitation, interconnect elements, such as interconnect lines, and via plugs between interconnect lines on different metal levels of an interconnect stack.

The integrated-circuit device of the invention has a diffusion-barrier layer stack, which comprises, in a direction from the Copper-containing feature to the dielectric layer, a CuSiN layer and a SiN layer. This layer combination provides an efficient barrier for suppressing Copper diffusion from the feature into the dielectric layer. Furthermore, a CuSiN/SiN layer sequence has a particularly strong interface with an improved adhesion between the layers of the diffusion-barrier layer stack and the dielectric layer, and thus improves the electromigration performance of the integrated-circuit device during operation. Therefore, the reliability of device operation and the lifetime of the integrate-circuit device are improved in comparison with prior-art devices.

An additional advantage of the integrated-circuit device of the invention is that CuSiN can also be formed at a top surface of the Copper-containing feature and represents an enhancement of process compatibility with electrolessly deposited self-aligned barriers, such as a CoWP barrier.

A further advantage of replacing the TaN/Ta layer sequence, which has been used in the prior art in a diffusion-barrier layer stack, is a reliability enhancement with respect to the upper edges of the feature, which are typically covered with a self-aligned CoWP layer. The upper edges of the Copper interconnect element face the TaN/Ta layer sequence at the sidewall of feature as well as the CoWP layer on the top face of the feature. In this situation, as was mentioned earlier, Ta oxidation or Cu corrosion was observed at the Cu/Ta interface. This issue is suppressed by the layer sequence of a CuSiN layer and a SiN layer present in the diffusion-barrier layer stack of the integrated-circuit device of the invention.

Thus, the diffusion-barrier layer stack that comprises the layer sequence of a CuSiN layer and a SiN layer provides an improvement over known diffusion barriers and has the potential to fully replace these prior-art barriers.

Silicon nitride is known per se in the art as a material, which is able to prevent diffusion of Copper into adjacent dielectric layers. This effect was described in U.S. Pat. No. 6,939,793 B1. However, U.S. Pat. No. 6,939,793 B1 fails to teach the layer sequence of a CuSiN layer and a SiN layer. Instead, this document teaches to use a metallic diffusion-barrier layer such as TaN, TiN, or WN.

In the following, preferred embodiments of the integrated-circuit device of the first aspect of the invention will be described. The embodiments can be combined with each other.

In one embodiment, the integrated-circuit device of the invention has a diffusion-barrier layer stack that has a CuSi layer, which is arranged between the Copper-containing feature and the CuSiN layer of the CuSiN/SiN layer sequence. CuSi has advantageous properties as a seed layer. It is further known as a diffusion barrier to Copper. A preferred CuSi layer contains less than 10% Si. An even further preferred embodiment has a CuSi layer which contains 1% Si.

In another embodiment, the Copper-containing feature comprises Copper grains. In this embodiment, Silicon can be incorporated at the boundaries of the Copper grains. This allows suppressing an easy path for voids diffusion.

Preferably, the dielectric material is a porous material. The porosity allows to provide a particularly low dielectric constant of the dielectric material, thus decreasing the capacitance and the RC delay time in the interconnections between circuit elements of an integrated-circuit device. Preferably, a porous ultra-low-k (P-ULk) material is used in the dielectric layer. Examples of suitable P-ULk materials are SiOCH, polymers like for instance materials known under the trademarks BD1 and BD2 from Applied materials, P-SILK from Dow Chemical, or Aurora from Novellus.

It is particularly useful in combination with the use of a porous dielectric material to provide the diffusion-barrier layer stack with a layer of $SiO_2$ between the SiN layer of the CuSiN/SiN layer sequence and the dielectric layer. The SiO$_2$ layer efficiently seals the pores of the dielectric material, and further generates O—H bonds on its surface, which facilitate a subsequent deposition of the SiN layer during fabrication of the integrated-circuit device. Preferably, atomic layer deposition (ALD) is used to deposit the SiO$_2$ layer in a conformal manner. Preferably, the SiO$_2$ layer is very thin, preferably smaller than or equal to 5 nm.

In integrated-circuit devices, wherein the Copper-containing feature is formed by an interconnect element, the diffusion-barrier layer stack preferably also extends along a via that connect the interconnect element to an underlying second interconnect element in an underlying second dielectric layer, i.e., on a lower metal level.

In one embodiment, a top face of the Copper-containing feature is covered in a direction of increasing distance from the feature with a layer sequence of a CuSiN layer and a SiN layer. This way, an efficient diffusion barrier is also formed on the top surface of the Copper-containing feature. Note that it is within the scope of the invention to only provide the CuSiN/SiN layer sequence on the top face of the Copper-containing feature, and not on the sidewalls of the feature, even if that is currently not a preferred embodiment.

According to a second aspect of the present invention, a method is provided for fabricating an integrated-circuit device with a Copper-containing feature in a dielectric layer. The method comprises the steps:
depositing a dielectric layer;
fabricating at least one Copper-containing feature in the dielectric layer; and
fabricating a diffusion-barrier layer stack, which comprises, in a direction from the feature to the dielectric layer, a CuSiN layer and a SiN layer.

In the method of the invention, the step of fabricating the diffusion-barrier layer stack is at least in part performed before or after or concurrently with the step of fabricating the at least one feature.

The advantages of the method of the second aspect of the invention correspond to those of the integrate-circuit device of the first aspect of the invention. Furthermore, the method of the invention is suitable for integration into advanced processing techniques in the context of the industrial fabrication of integrated-circuit devices using ultra-large-scale integration (ULSI) technology.

In the following, preferred embodiments of the method of the second aspect of the invention will be described. The embodiments can be combined with each other.

In a preferred embodiment that is compatible with a Dual Damascene process, fabricating the Copper-containing feature preferably comprises fabricating an opening in the dielectric layer and depositing Copper in the opening.

In one embodiment the method of the second aspect of the invention, the step of fabricating the diffusion-barrier layer stack comprises
providing the dielectric layer with at least one opening for the at least one feature, the opening having sidewalls;
depositing a SiN layer on the sidewalls of the opening before fabricating the feature;
depositing a CuSi layer on the sidewalls of the opening after depositing the SiN layer and before fabricating the Copper-containing feature; and annealing the integrated-circuit device after fabricating the Copper-containing feature for transforming the CuSi layer into a CuSiN layer.

In this embodiment, which is also compatible with a Dual Damascene process, an additional CuSi layer is deposited as a seed layer for subsequent deposition of the Copper-containing material of the feature. The CuSi layer is transformed in this embodiment into a CuSiN layer by an annealing step after fabricating the Copper-containing feature. The present embodiment therefore forms an example, where fabricating the diffusion-barrier layer stack is partly performed before the step of fabricating the feature, and partly performed after the step of fabricating the feature.

Preferably, the annealing step is performed for an annealing time span and at annealing temperature, such that the CuSi layer is either completely or only partially transformed into a CuSiN layer, resulting in a CuSi/CuSiN/SiN diffusion-barrier layer stack on the sidewalls of the feature.

In a further embodiment, where the dielectric layer is deposited as a porous dielectric layer, a step of depositing a SiO$_2$ layer on the sidewalls of the openings is performed before depositing the SiN layer. Beside the mentioned effect of efficiently sealing the pores of the dielectric layer, the SiO$_2$ layer generates O—H bonds on its surface, which facilitate the subsequent deposition of a SiN layer, which is preferably performed by atomic layer deposition. Preferably, the hydrogen is provided by using an H-containing precursor such as silane or tetraethylorthosilicate (TEOS).

The SiN layer is preferably deposited as an ultra thin N-rich SiN liner.

The Copper-containing feature is preferably fabricated by depositing Copper in the opening after depositing the CuSi layer and before the annealing step. The Copper deposition can be performed by known methods such as electrochemical deposition (ECD).

In a further preferred embodiment, fabricating the feature comprises a step of planarizing a top surface of the dielectric layer by removing Copper and the CuSiN layer using a chemical mechanical polishing (CMP) process that is selective to Copper-containing material and does not remove underlying dielectrics. CMP processes, which provide selectivity to Copper-containing material and do not remove underlying dielectrics are per se known in the art. However, in the context of the present invention, due to the layer structure deposited on the surface, the high CMP-selectivity between the metal and the dielectric allows decreasing the surface roughness all over a wafer used for the fabrication of the integrated-circuit device.

In a further embodiment, after fabricating the feature, a top face of the feature is covered with a SiN liner. After this step, a second annealing step is performed to form a layer sequence of a CuSiN layer and a SiN layer in a direction of increasing distance from the feature. By the present embodiment, a the diffusion-barrier layer stack is formed on the top face of the feature. It is formed of the same layer sequence of a CuSiN layer and a SiN layer that has been described before as an effective diffusion barrier for Copper.

As an alternative to a SiN-liner deposition, a treatment of the top face of the feature with a NH$_3$ plasma, followed by a thin SiCN-layer deposition can be performed. The SiCN-layer deposition can optionally be omitted.

Further preferred embodiments of the invention are designed in the dependent claims. It shall be understood that the integrated-circuit device of claim 1 and the method of claim 9 have corresponding preferred embodiments, as defined in the dependent claims.

BRIEF DESCRIPTION OF THE DRAWINGS

The invention will now be explained in more detail with reference to the drawings in which.

DETAILED DESCRIPTION OF EMBODIMENTS

FIGS. 1-8 show an interconnect element of an integrated-circuit 100 device in a schematic cross-sectional view during different stages of its fabrication.

The schematic cross-sectional view of FIGS. 1-8 focuses on a section of an interconnect stack 102 of the integrated-circuit device. The section shown forms a part of a metal level 104 on top of an underlying metal level 106. As an illustrative example, metal level 104 could form a third metal level of the interconnect stack 102, and metal level 106 could form the second metal level of the interconnect stack 102.

Figure 1:
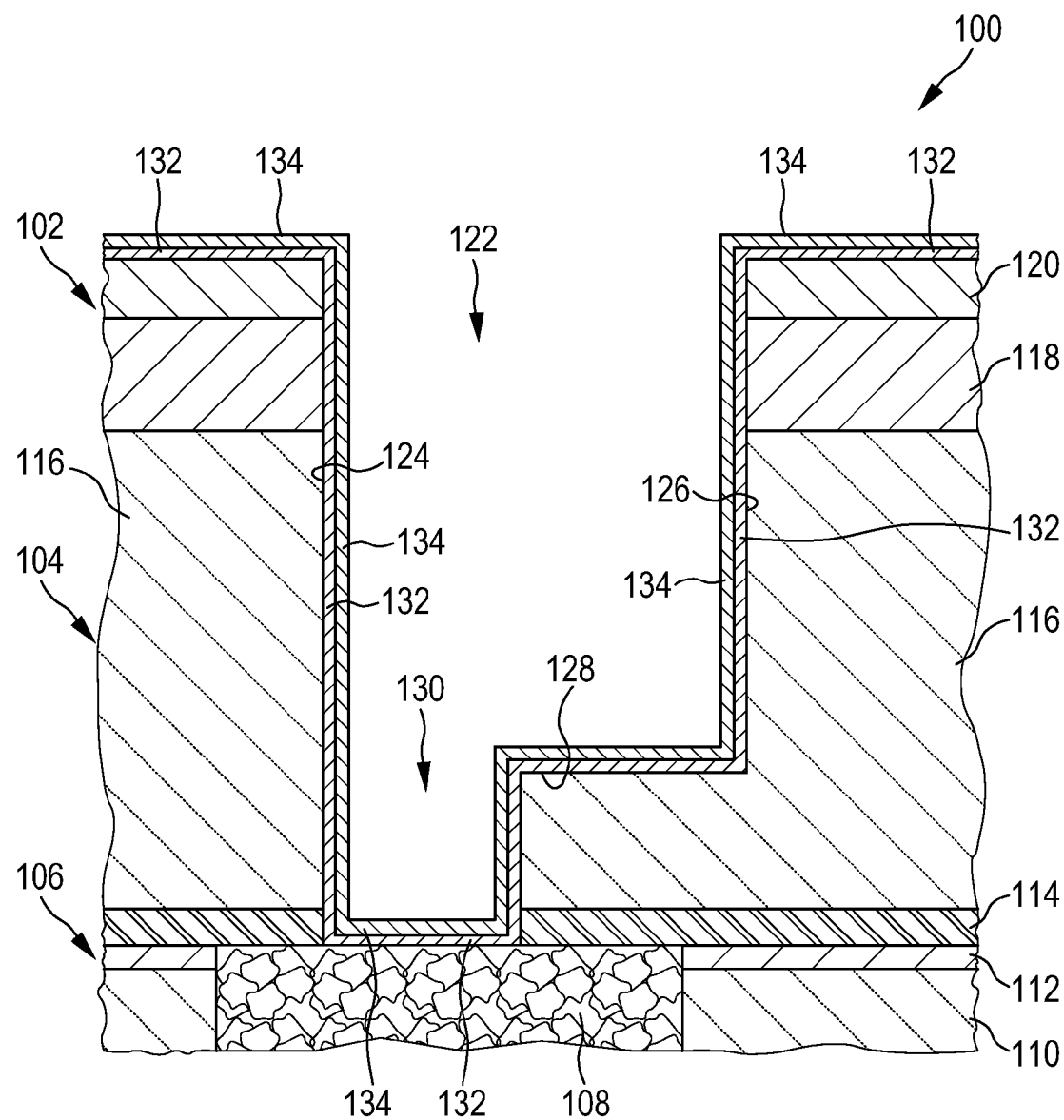
FIGS. 1-8 show a metal level of an interconnect stack of an integrated-circuit device in a schematic cross-sectional view during different stages of fabrication of an interconnect element.

At the processing stage shown in FIG. 1 the underlying metal level 106 has been completed and comprises a metal interconnect element 108, which is laterally embedded in a dielectric layer 110. Note that in FIG. 1 the cross-section of metal level 106 is represented in a simplified manner. The structure of metal level 104 can be used on all metal levels. However, it is also possible to use sidewall barriers that can be either standard metal barriers such as TaN/Ta or have the structure of the diffusion-barrier layer stack as described here for metal level 104.

On top of the dielectric layer 110, a $SiO_2$ layer 112 is provided outside the range of the metal interconnect element 108. The metal level 106 terminates with a SiCN layer 114, which covers the dielectric layers 110 and 112 and the metal interconnect element 108.

At the processing stage shown in FIG. 1, the metal level 104 is still incomplete. It comprises a porous ultra-low-k (ULk) layer 116, a $SiO_2$ layer 118, and a TiN layer 120. An opening 122 is formed in this layer stack. The opening has a rectangular cross section with sidewalls 124 and 126 and a bottom face 128. In the bottom face 128, a via opening 130 is formed that extends down to the metal interconnect element 108. The via opening takes up about the left half of the bottom face 128 of the opening 122.

At the processing stage of FIG. 1, the sidewalls 124 and 126 and the bottom face 128 of the opening 122 as well as the sidewalls and the bottom face of the via opening 130, and the top surface of the TiN layer 120 are covered with a $SiO_2$ liner 132 and a SiN liner 134. The purpose of the $SiO_2$ liner 132 is to provide a pore sealing on the sidewalls 124 and 126 of the porous ULk layer 116. It also serves to generate O—H bonds on its surface, which facilitate the subsequent deposition of the SiN liner 134. Both, the $SiO_2$ liner 132 and the SiN liner 134 are deposited by atomic layer deposition (ALD). The thickness of the $SiO_2$ liner 132 is preferably smaller than or equal to 5 nm. In one embodiment it is 3 nm. The thickness of the SiN liner 134 is preferably also smaller than or equal to 5 nm. In one embodiment it is 3 nm.

Figure 2:
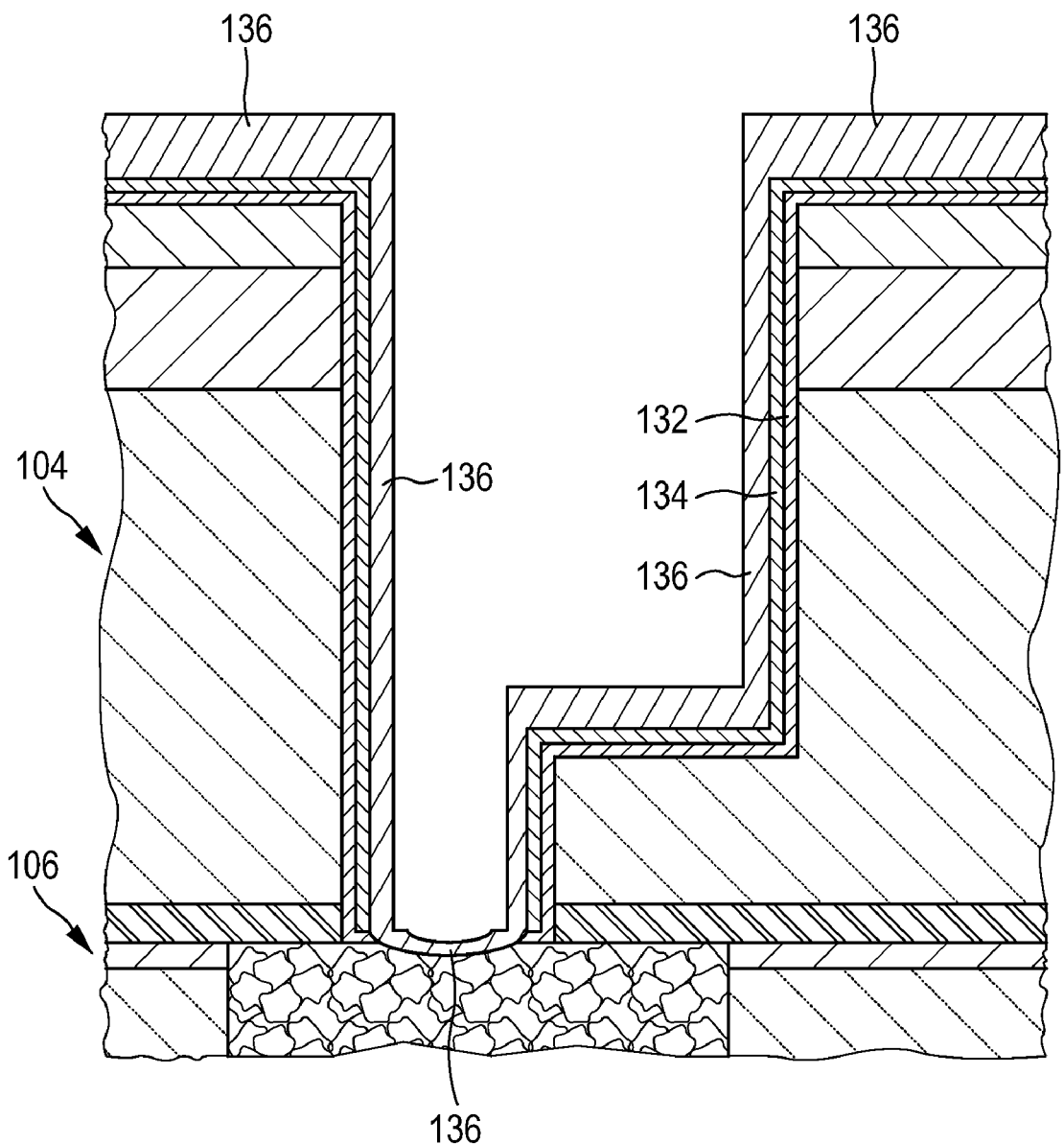

At the next processing stage, which is shown in FIG. 2, a CuSi seed layer 136 has been deposited. Also, a punch-through process has been performed that opens the bottom face of the via opening towards the metal interconnect element 108 and enables the later formation of an electrical connection between the metal levels 104 and 106.

The CuSi seed layer 136 has a low Si content of about 1%. It can be deposited by physical vapor deposition (PVD). The thickness of the CuSi seed layer 136 is preferably smaller than or equal to 20 nm. In preferred embodiments it is smaller than or equal to 5 nm.

Figure 3:
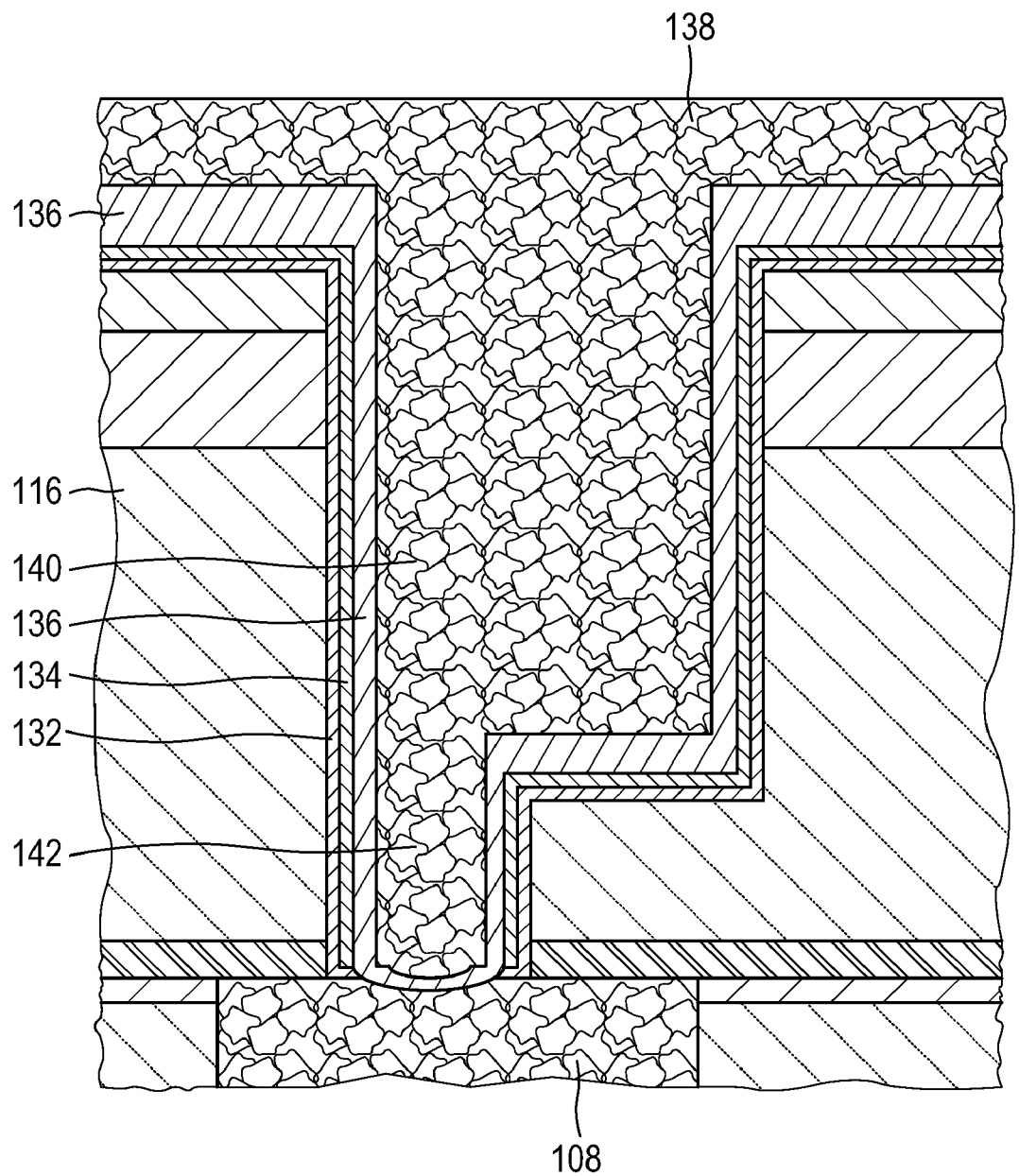

In a subsequent processing stage, which is shown in FIG. 3, the opening 122 has been filled with Copper by known electrochemical deposition techniques. The Copper filling 138 extends through the via opening 130, thus forming an interconnect element 140 and a conductive via 142. The Copper filling 138 also extends over the surface of the metal level 104. This part is to be removed during a later processing stage. The copper filling has a grain structure that is schematically represented by the hatching of the filling 138.

Figure 4:
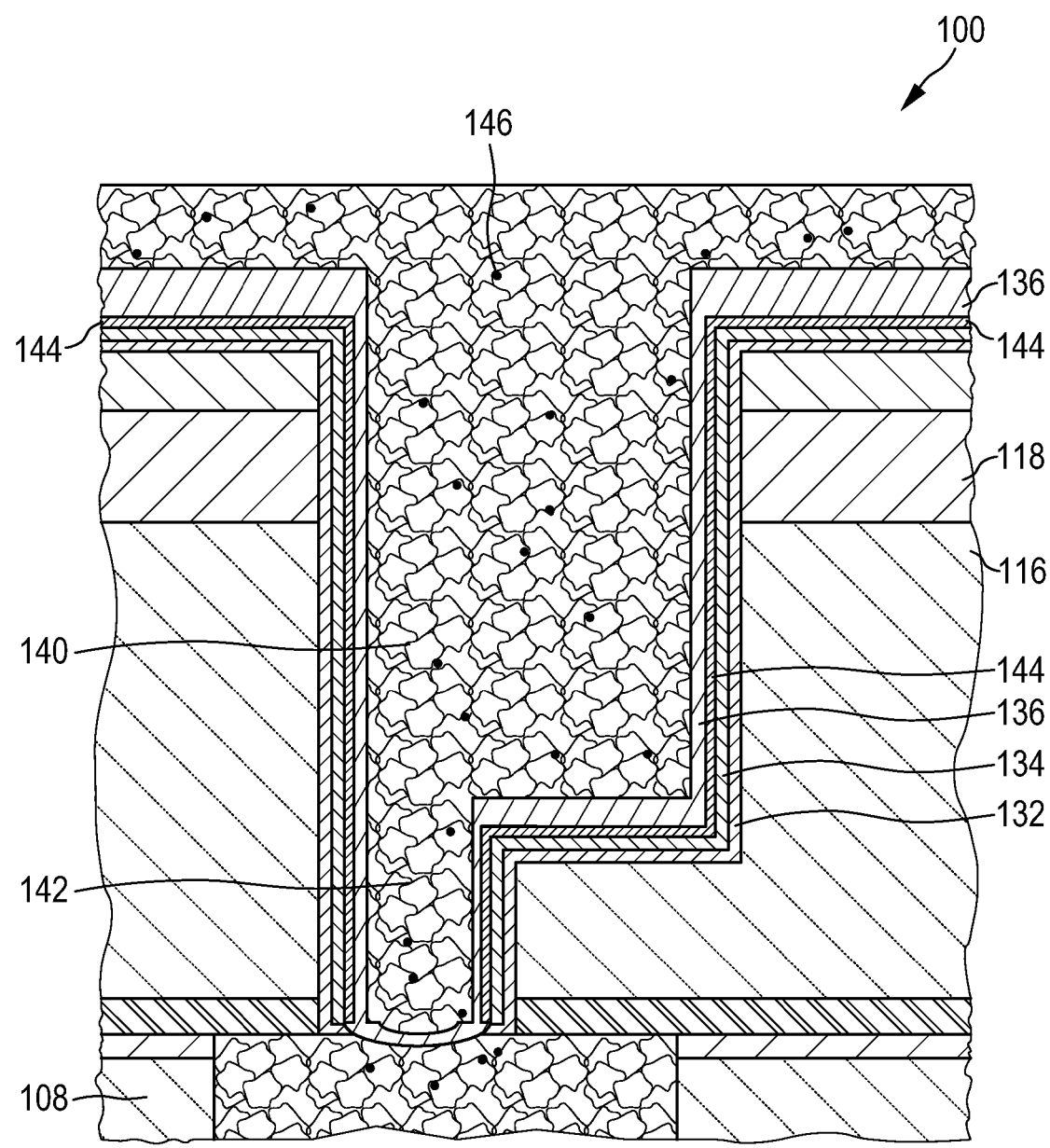

In a subsequent processing stage, which is shown in FIG. 4, an annealing step has been performed, in which the CuSi seed layer 136 is partially transformed into a CuSiN layer 144. This way, a sidewall diffusion-barrier layer stack 146 is formed, which, in a lateral direction from the interconnect element 140 to the dielectric layer 116, 118 comprises the layer sequence formed by the CuSi layer 136, the CuSiN layer 144, the SiN layer 134, and the $SiO_2$ layer 132. Most importantly, the layer sequence formed by the CuSiN layer 144 and the SiN layer 134 forms a very effective barrier against Copper diffusion. Furthermore, the film adhesion is improved in comparison with prior-art structures, resulting in an enhanced electromigration performance. The improved adhesion of the sidewall diffusion-barrier layer stack to the porous ULk layer 116 therefore improves the reliability of the integrated-circuit device 100 during operation.

The annealing step that has been performed between the processing stages of FIG. 3 and FIG. 4 also leads to the formation of Copper-grain boundaries, which incorporate silicon. This is graphically represented in FIG. 4 by full circles (representing the presence of silicon atoms) arranged at grain boundaries in the interconnect element 140 and the via 142, and also into metal interconnect element 108. An example of a "silicon atom" is shown by reference label 146. Si atoms in solution can also be present in the Cu grains, not only at the grain boundaries.

Figure 5:
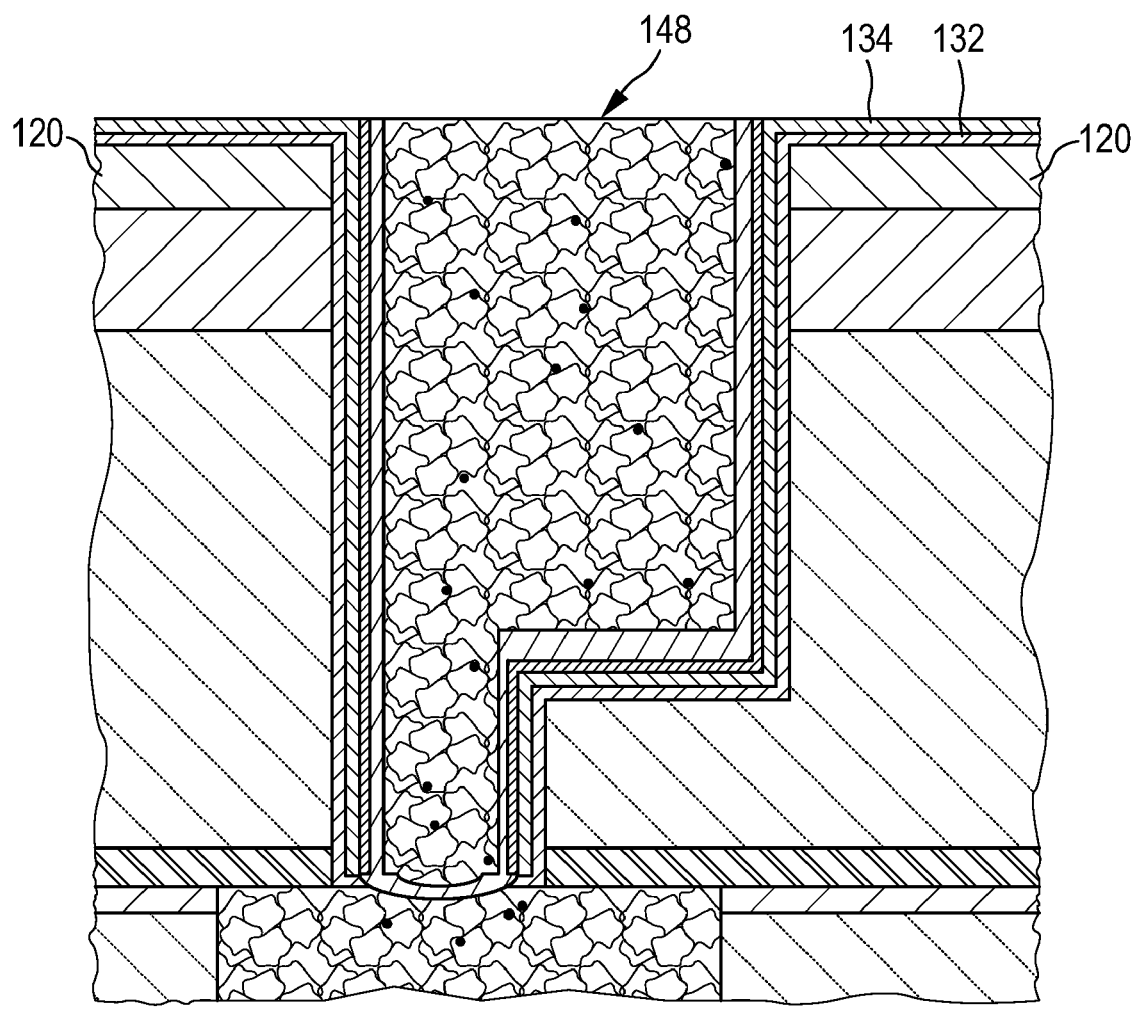

In a subsequent processing stage, which is shown in FIG. 5, a Cu-based material chemical mechanical polishing (CMP) step with high selectivity with respect to the underlying dielectric materials has been performed. In comparison with prior-art layer structures, the use of the dielectric material in the diffusion-barrier layer stack provides for a high CMP-selectivity, which allows to fabricate a particularly flat and smooth surface 148 in the CMP-step.

Figure 6:
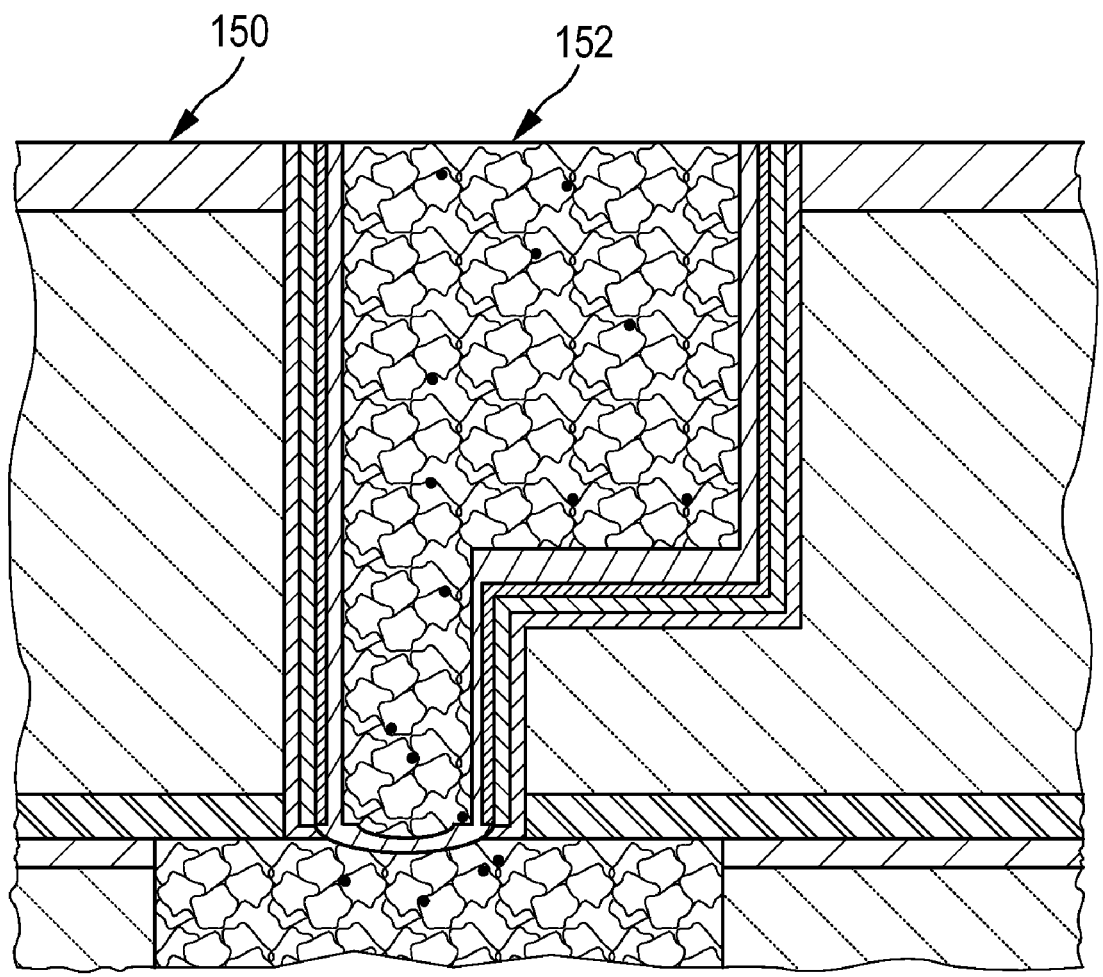

After removing the Copper from the surface 148, a subsequent second CMP-step is performed, in which the SiN layer 134, the $SiO_2$ layer 132, and the TiN layer 120 are removed, thus forming a $SiO_2$ surface 150 in the region of the dielectric material, and a Copper surface 152 in the region of the interconnect element 140, cf. FIG. 6.

Figure 7:
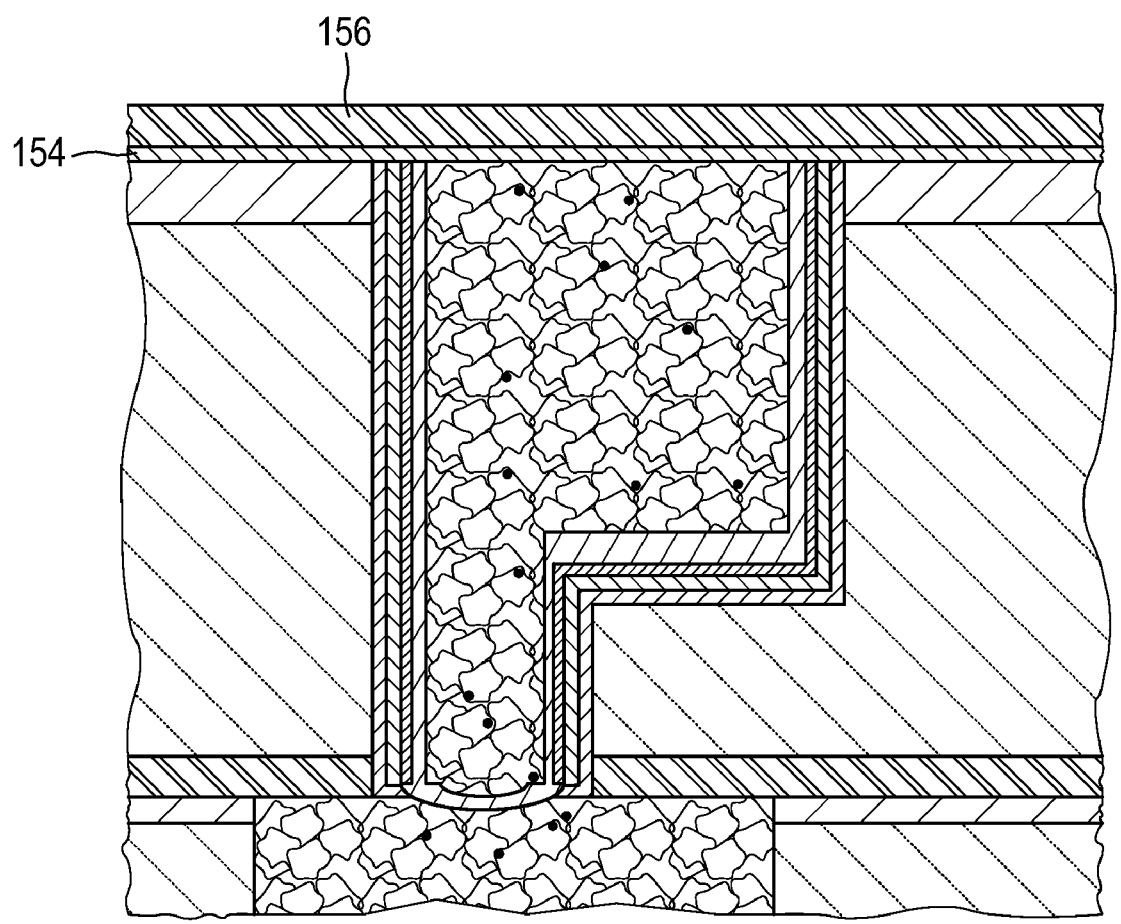
Figure 8:
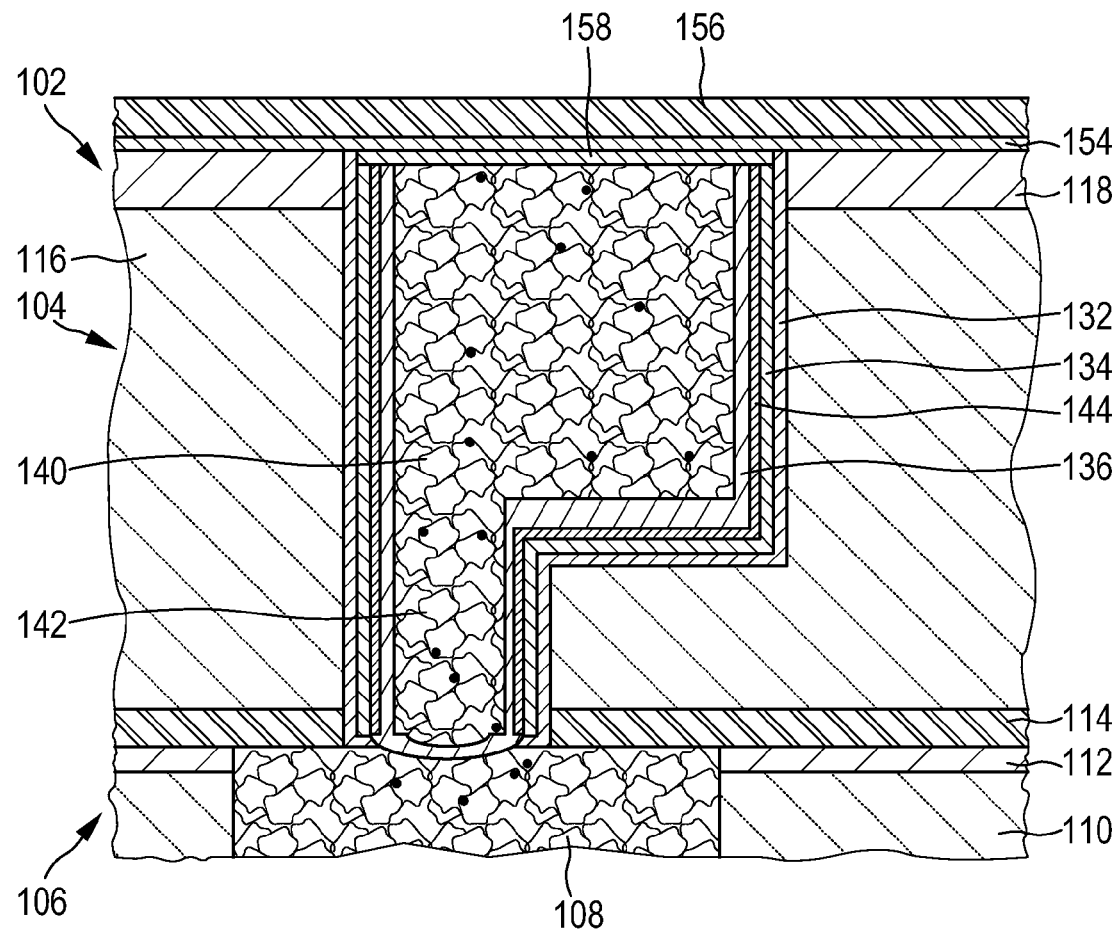

Subsequently, as shown in FIG. 7, the structure is covered with an ultra thin N-rich SiN liner 154, and, optionally, with a SiCN layer 156. By performing a second annealing step, a CuSiN layer 158 is formed between the Copper of the interconnect element 140 and the SiN liner 154, resulting in a self-aligned diffusion-barrier formation on the top face of the interconnect element 140, cf. FIG. 8.

'As an alternative to the deposition of the SiN liner 156 a $NH_3$ plasma treatment of the surface can be performed to form the CuSiN barrier thanks to available Si atoms present in the Cu metal level. Furthermore, the reaction can be enhanced using an optional second annealing step.

A further alternative is the formation of a layer stack of an SiN layer and a CuSi layer followed by an annealing step.

More details of the integrated-circuit device 100 are not shown in the Figs. because they are not relevant for describing the invention and can be designed according to the knowledge of a person of ordinary skill in the art. The structure shown in the Figs. is of illustrative nature and should not be interpreted as limiting the invention, for instance to the specific geometrical structure or to a specific layer structure beyond that defined by the independent claims. It should also be kept in mind that the invention is not restricted to interconnect elements but can be used for different Copper-containing features as well.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. An integrated-circuit device comprising:
a dielectric layer having an opening that includes sidewalls;
at least one Copper-containing feature in the opening of the dielectric layer; and
a diffusion-barrier layer stack arranged between the at least one Copper-containing feature and the dielectric layer at the sidewalls, which diffusion-barrier layer stack comprises, in a direction from the at least one Copper-containing feature to the dielectric layer, a layer sequence of a CuSiN layer and a SiN layer.

2. The integrated-circuit device of claim 1, wherein a CuSi layer is arranged between the at least one Copper-containing feature and the CuSiN layer of the diffusion-barrier layer stack.

3. The integrated-circuit device of claim 1, wherein the at least one Copper-containing feature comprises Copper grains, in which Silicon (146) is incorporated at a boundary to another Copper grain.

4. The integrated-circuit device of claim 1, wherein the dielectric material is a porous material.

5. The integrated-circuit device of claim 1, wherein the diffusion-barrier layer stack further comprises a layer of $SiO_2$ between the SiN layer and the dielectric material.

6. The integrated-circuit device of claim 1, wherein the at least one Copper-containing feature is an interconnect element.

7. The integrated-circuit device of claim 6, wherein the interconnect element comprises a via plug to an underlying second interconnect element in an underlying second dielectric layer.

8. The integrated-circuit device of claim 1, wherein the at least one Copper-containing feature has a top surface, which is covered, in a direction of increasing distance from the at least one Copper-containing feature, with a layer sequence of a CuSiN layer and a SiN layer.

9. A method for fabricating an integrated-circuit device with a Copper-containing feature in a dielectric layer, comprising the steps:
depositing a dielectric layer;
providing the dielectric layer with at least one opening, the opening having sidewalls;
fabricating at least one Copper-containing feature in the opening of the dielectric layer; and
fabricating a diffusion-barrier layer stack on the sidewalls of the opening, which comprises, in a direction from the at least one Copper-containing feature to the dielectric layer, a layer sequence of a CuSiN layer and a SiN layer;
wherein the step of fabricating the diffusion-barrier layer stack is performed before or after or concurrently with the step of fabricating the at least one Copper-containing feature.

10. The method of claim 9, wherein fabricating the diffusion-barrier layer stack comprises:
depositing a SiN layer on the sidewalls of the opening before fabricating the at least one Copper-containing feature;
depositing a CuSi layer on the sidewalls of the opening after depositing the SiN layer and before fabricating the at least one Copper-containing feature; and
annealing the integrated-circuit device after fabricating the at least one Copper-containing feature for transforming the CuSi layer into a CuSiN layer.

11. The method of claim 10, wherein the annealing step is performed for an annealing time span and at an annealing temperature such that the CuSi layer is only partially transformed into the CuSiN layer, resulting in a CuSi/CuSiN/SiN barrier layer stack.

12. The method of claim 10, wherein fabricating the at least one Copper-containing feature comprises a step of depositing Copper in the opening after depositing the CuSi layer and before the annealing step.

13. The method of claim 12, wherein fabricating the at least one Copper-containing feature comprises a step of planarizing a top surface of the dielectric layer by removing Copper and the CuSiN layer from the top surface using a chemical mechanical polishing process that is selective to Copper-containing material and does not remove underlying dielectrics.

14. The method of claim 9, wherein the dielectric layer is deposited as a porous dielectric layer, and wherein a step of depositing a $SiO_2$ layer on the sidewalls of the opening is performed before depositing the SiN layer.

15. The method of claim 9, wherein after fabricating the at least one Copper-containing feature, a top face of the at least one Copper-containing feature is covered with a SiN liner, hereafter a second annealing step is performed to form a layer sequence of a CuSiN layer and a SiN layer in a direction of increasing distance from the at least one Copper-containing feature.

* * * * *